(12) United States Patent
Boskamp (10) Patent No.: US 6,404,201 B1
(45) Date of Patent: Jun. 11, 2002

(54) MAGNETIC RESONANCE IMAGING RF COIL

(75) Inventor: Eddy B. Boskamp, Menomonee Falls, WI (US)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 09/681,972

(22) Filed: Jul. 2, 2001

(51) Int. Cl.$^7$ .................................................. G01V 3/00
(52) U.S. Cl. ........................ 324/318; 324/319; 324/322
(58) Field of Search ................................ 324/318, 319, 324/322, 300, 312, 314; 600/422

(56) References Cited

U.S. PATENT DOCUMENTS

| | | |
|---|---|---|
| 5,646,530 A | 7/1997 | Strenk et al. |
| 5,744,957 A | 4/1998 | Vaughan, Jr. |
| 5,886,596 A | 3/1999 | Vaughan, Jr. |
| 6,040,697 A | 3/2000 | Misic |
| 6,236,206 B1 * | 6/2001 | Harthman et al. .......... 324/318 |

* cited by examiner

Primary Examiner—Hezron Williams
Assistant Examiner—Brij B. Shrivastav
(74) Attorney, Agent, or Firm—Michael A. Della Penna (57) ABSTRACT

A radio frequency (RF) coil system for resonance imaging/analysis comprising a primary coil element having a plurality of axial conductors spaced to form a generally tubular structure having two ends and defining a coil volume, and a first pair of spoiler coils. The first pair of spoiler coils each comprising a plurality of axial conductors spaced to form a generally tubular structure and defining a coil volume. Each of the spoiler coils is positioned adjacent to and overlapping an end of the primary coil. Each of the primary and spoiler coils is also adapted to carry an RF signal, wherein the signal in the spoiler coils is 180 degrees out of phase with the signal in the primary coil. The counter-phased spoiler coils act to rapidly drive down the RF magnetic field generated by the primary coil in the region of the ends of the primary coil to reduce the occurrence of aliasing artifacts from outside the imaging field of view.

20 Claims, 7 Drawing Sheets

MAGNETIC RESONANCE IMAGING RF COIL

BACKGROUND OF INVENTION

The present invention relates to the field of magnetic resonance imaging (MRI) systems and, more particularly, concerns radio frequency (RF) coils for use in such systems.

In MRI systems or nuclear magnetic resonance (NMR) systems, radio frequency signals are provided in the form of circularly polarized or rotating magnetic fields having an axis of rotation aligned with a main magnetic field. An RF field is then applied in the region being examined in a direction orthogonal to the static field direction, to excite magnetic resonance in the region, and resulting RF signals are detected and processed. Receiving coils intercept the radio frequency magnetic field generated by the subject under investigation in the presence of the main magnetic field in order to provide an image of the subject. Typically, such RF coils are either surface-type coils or volume-type coils, depending upon the particular application. Normally, separate RF coils are used for excitation and detection, but the same coil or array of coils may be used for both purposes.

Conventional MRI systems have a number of artifact problems. For example, aliasing of unwanted signals into the resonance object image is a common problem in MRI applications. A particular form of artifact, sometimes referred to as an aliasing artifact, can occur in the either the frequency direction or the phase direction within MRI systems. In this type of artifact, an area of anatomy that is at least partially within the excitation field of the body coil has a local Larmor frequency identical to a pixel within the imaging field of view. This phenomenon typically originates from areas outside the field of view, but causes artifacts inside the image. It often arises as a result of the non-linearity of the gradient fields and/or non-homogeneity of the DC magnetic fields.

Accordingly, to reduce the occurrences of unwanted artifacts, there exists a need for MRI systems having improved linearity of gradient fields and homogeneity of DC magnetic fields in RF transmit coils with zero sensitivity outside the imaging field of view.

SUMMARY OF INVENTION

In the present invention, the aforementioned problem is solved through the provision of a novel transmit coil or array of coils that is sensitive in the imaging volume, but radically drops off in sensitivity outside of the image field of view. An advantage of the present invention is that it does not excite the spin system in areas where the aliasing artifact originates.

In particular, the present invention provides a radio frequency (RF) coil system for magnetic resonance imaging/analysis comprising a primary coil element having a plurality of axial conductors spaced to form a generally tubular structure having two ends and defining a coil volume, and a first pair of spoiler coils. The spoiler coils each comprise a plurality of axial conductors spaced to form a generally tubular structure and define a coil volume. Each of the spoiler coils is positioned adjacent to and slightly overlapping an end of the primary coil. Each of the primary and spoiler coils is also adapted to carry an RF signal, wherein the signal in the rungs of the spoiler coils is 180 degrees out of phase with the signal in the rungs of the primary coil.

In another aspect of the invention, an additional pair of spoiler coils are added adjacent to and outside of the first pair of spoiler coils with the signal carried in the additional pair of spoiler coils being 180 degrees out of phase with the signal carried in the first pair of spoiler coils.

In a further aspect of the invention, a RF apparatus for use in a nuclear magnetic resonance (NMR) system is provided. The RF coil has a generally tubular structure defined by an inner wall and an outer wall, the inner wall defining an imaging volume. The RF coil also comprises a plurality of discrete electrically conductive members positioned between the inner wall and the outer wall which are equally circumferentially spaced around the tubular structure so as to form opposing pairs of conductive members. Each of the conductive members comprises a conductive loop having a primary coil section and a spoiler coil section at each end of the primary coil section configured such that a current flow of a signal on the loop in a cross-over region between each of the spoiler coils and the primary coil is in opposite directions.

An advantage of the present invention is that it provides homogeneity of the magnetic field throughout the image field of view, but radically drops off in sensitivity outside the field of view to reduce the likelihood of aliasing artifacts. Other objects and advantages of the invention will become apparent upon reading the following detailed description and appended claims, and upon reference to the accompanying drawings.

BRIEF DESCRIPTION OF DRAWINGS

For a more complete understanding of this invention, reference should now be made to the embodiments illustrated in greater detail in the accompanying drawings and described below by way of examples of the invention.

In the drawings.

DETAILED DESCRIPTION

It is important in nuclear magnetic resonance (NMR) and magnetic resonance imaging (MRI) applications to maximize the signal-to-noise ratio of the system, and to irradiate all parts of the object under consideration with the same strength RF field. In this regard, an important characteristic of an RF transmit coil is to provide a homogeneous magnetic field in the volume of the RF coil. Conversely, if a coil provides homogeneous excitation, it will also receive a NMR signals in a homogeneous fashion. Accordingly, in the discussion which follows, references to excitation distributions of the coils of the present invention apply with equal relevance to their use as a NMR receiver. In addition, although the present invention will be described with reference to a "birdcage" whole body transmit coil and an RF whole body transmit coil, the teachings herein are equally applicable to other types of volume coils used in a NMR imaging applications.

Figure 1:
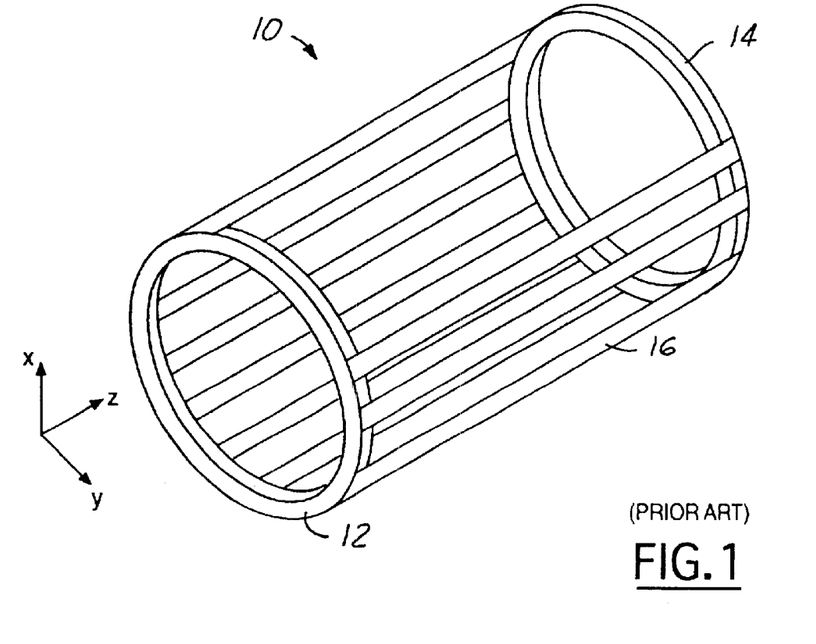
FIG. 1 is a perspective view of a single quadrature birdcage coil according to the prior art.

Referring now to FIG. 1, there is shown a perspective view of a single quadrature birdcage coil 10 according to the prior art. The birdcage coil 10 consists of two rings 12, 14 which form circular conductive loops which are connected to each other and spaced apart from each other by conductive connection members or rungs 16. Typically, there are eight, twelve or sixteen electrically conductive connecting members 16 joining the circular conductive rings 12, 14 and each rung is equally circumferentially spaced. Such quadrature transmit and receiving coils 10 are designed for receiving a variety of anatomical regions of the body such as the knee, leg, arm, or the entire body and are thus referred to as volume coils. The coils 10 are typically disposed around a hollow cylindrical drum (not shown) to provide structural support for the coil 10. The primary RF magnetic field of the coil 10 is perpendicular to the direction of the z-axis shown in FIG. 1.

For transmission, a waveform generator and power amplifier communicate RF waveforms to the conductive members to generate the RF magnetic field. For reception, electrical leads (not shown) are connected to the coil 10 to communicate the received signals to a data acquisition system as is known in the art. Such data processing systems typical comprise a data processing channel including an individual amplifier, filter, and A/D converter for processing the image signals received by a corresponding coaxial lead connected to the birdcage coil 10. The outputs of the data processing channels are then multiplexed and combined by a microprocessor according to a processing algorithm to produce and display an overall image signal.

An advantage of the birdcage coil design is that it creates a homogeneous RF field in the x-y plane and to a lesser extent, along the z-axis direction. A disadvantage of the coil, however, is that it has a significant amount of stray magnetic field beyond the endings of the coil. Preferably, the magnetic field should fall off rapidly outside of the imaging field of view to prevent the occurrence of image artifacts.

Figure 2:
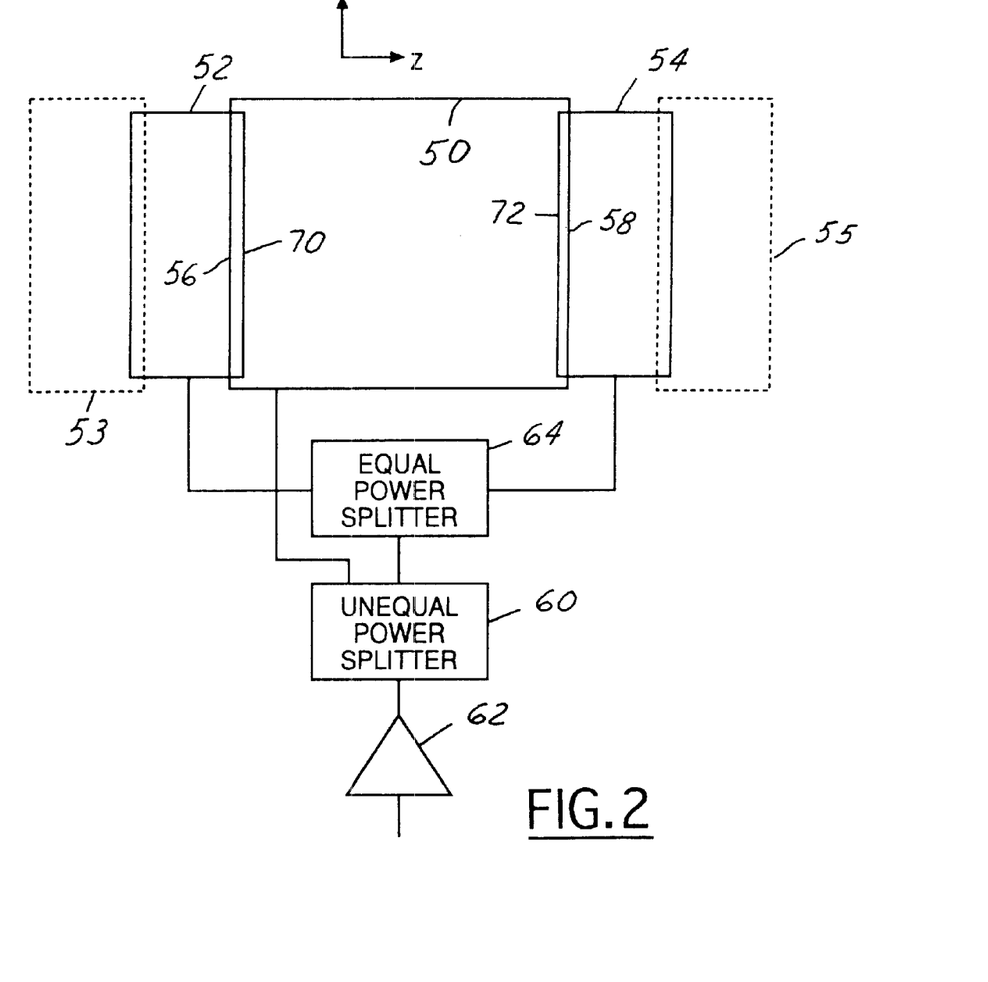
FIG. 2 is a schematic view of a receiver/transmitter coil system according to one embodiment of the present invention.

Referring now to FIG. 2 there is shown a schematic diagram of a transmitter/receiver system according to one embodiment of the present invention. The coil system of FIG. 2 comprises three birdcage coils, a primary birdcage coil 50 and two small birdcage coils referred to spoilers 52, 54 on either end of the primary birdcage 50. The birdcages are arranged such that the rung current in the spoilers 52, 54 is 180° out of phase with the rung current flowing through the primary birdcage 50. This creates a counter field at each end 56, 58 of the primary birdcage coil 50 which drives the field amplitude down faster in those areas and, as a result, significantly reduces any stray magnetic field outside the field of view of the primary birdcage coil 50. An unequal power splitter 60 is used to shift the current phase of the signal received from amplifier 62 by 180° before it is split by an equal power splitter 64 and transmitted to each of the spoilers 52, 54. Alternatively, the unequal power splitter 60 can comprise two amplifiers to accomplish the desired current phase shift. In such a case, unequal power splitter 60 comprises two amplifiers, one feeding the equal power splitter 64 and one feeding the primary birdcage 50 with a current 180° out of phase with the signal transmitted to each of the spoiler birdcages 52, 54.

Each of the primary birdcage 50 and spoilers 52, 54 can be linear birdcages as shown or quadrature birdcages as described above. The amount of overlap between the primary birdcage 50 and each respective spoiler 52, 54 is on the order of approximately 2 to 10 mm. Furthermore, due to the current phase shift, the current in end ring 56 of primary birdcage 50 will be in the same direction as the current flow of end ring 70 of spoiler 52. Similarly, the current flow of end ring 58 of the primary birdcage 50 will be in the same direction as that of end ring 72 of spoiler 54. The current flowing in the rungs of each of the primary birdcage 50 and spoilers 52, 54, however, are opposite for the same as azimuthal angle.

In a preferred embodiment, the primary birdcage 50 is approximately 40 cm long in the z-axis direction and each of the spoiler birdcages 52, 54 are 12 cm in length in the z-axis direction.

Additional birdcage spoilers 53, 55 may also be added, each having a rung current flow 180° out of phase with respect to the rungs of its adjacent birdcage 52, 54. The amount of the magnetic field drop off and the magnitude of the field recovery after going through the zero crossing can be adjusted by varying the length of the primary birdcage 50, the length of the spoilers 52, 54, the current ratio between the primary birdcage 50 and its respective spoilers 52, 54, the angle between the conductors and the z-axis or RF shield, as well as the number of sets of spoilers surrounding the primary birdcage 50.

Figure 2A:
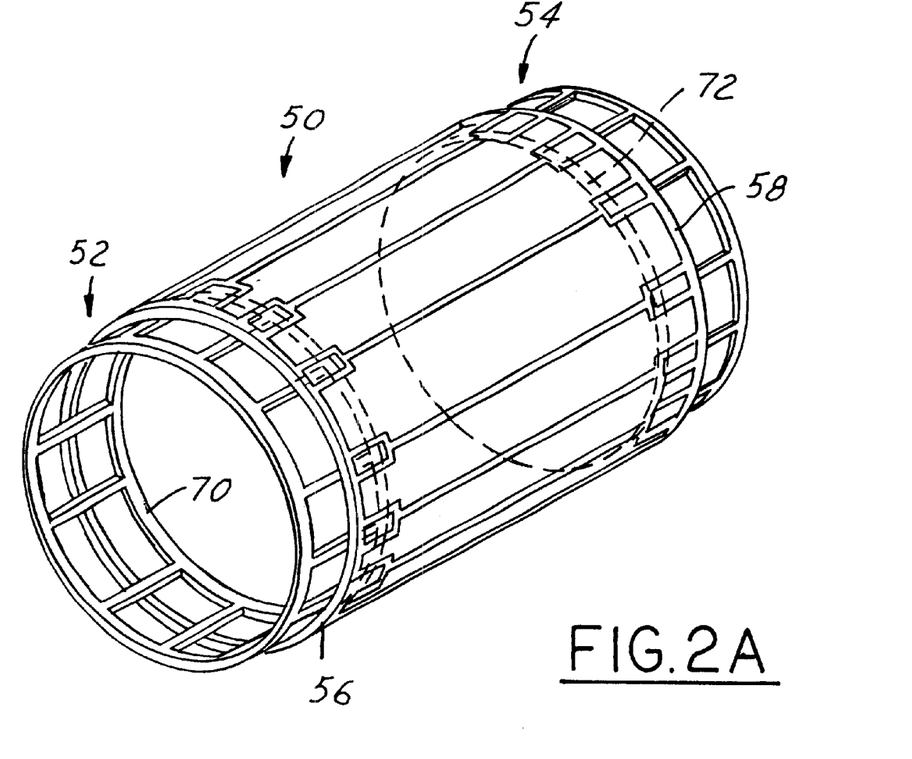
FIG. 2A is a perspective view of the primary and spoiler birdcage coils of FIG. 2.

FIG. 2A is a perspective view of one embodiment of the primary birdcage oil 50 and .spoiler birdcage coils 52, 54 of FIG. 1. The rung and ladder configuration of the primary birdcage 50 and spoiler birdcages 52, 54 as well as the overlap of the end rings 70, 56 and 72, 58, respectively, can be clearly seen.

Figure 5:
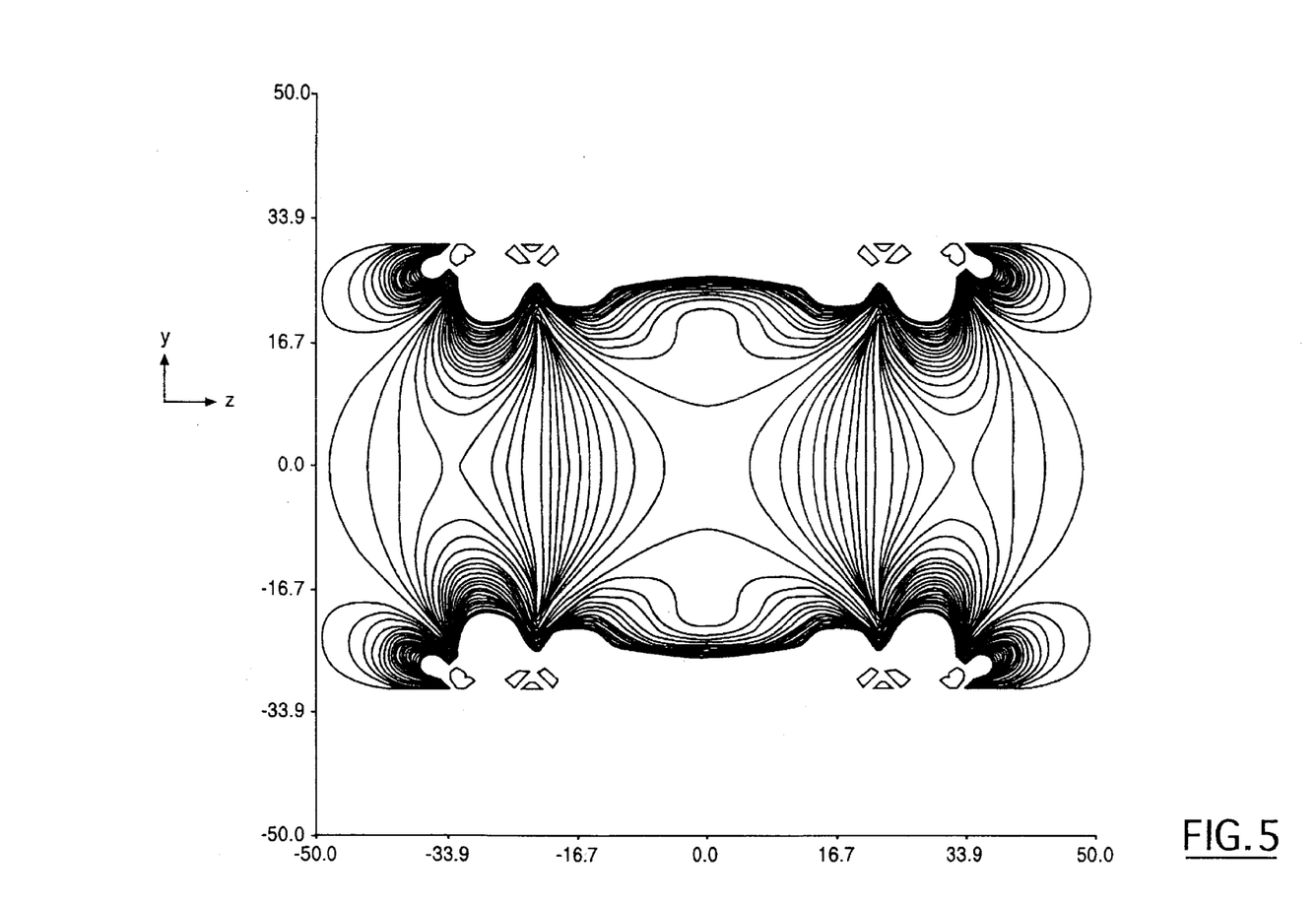
FIG. 5 is an isocontour plot of the RF field amplitudes projected in the x-y plane for the receiver/transmitter system of FIG. 2.
Figure 6:
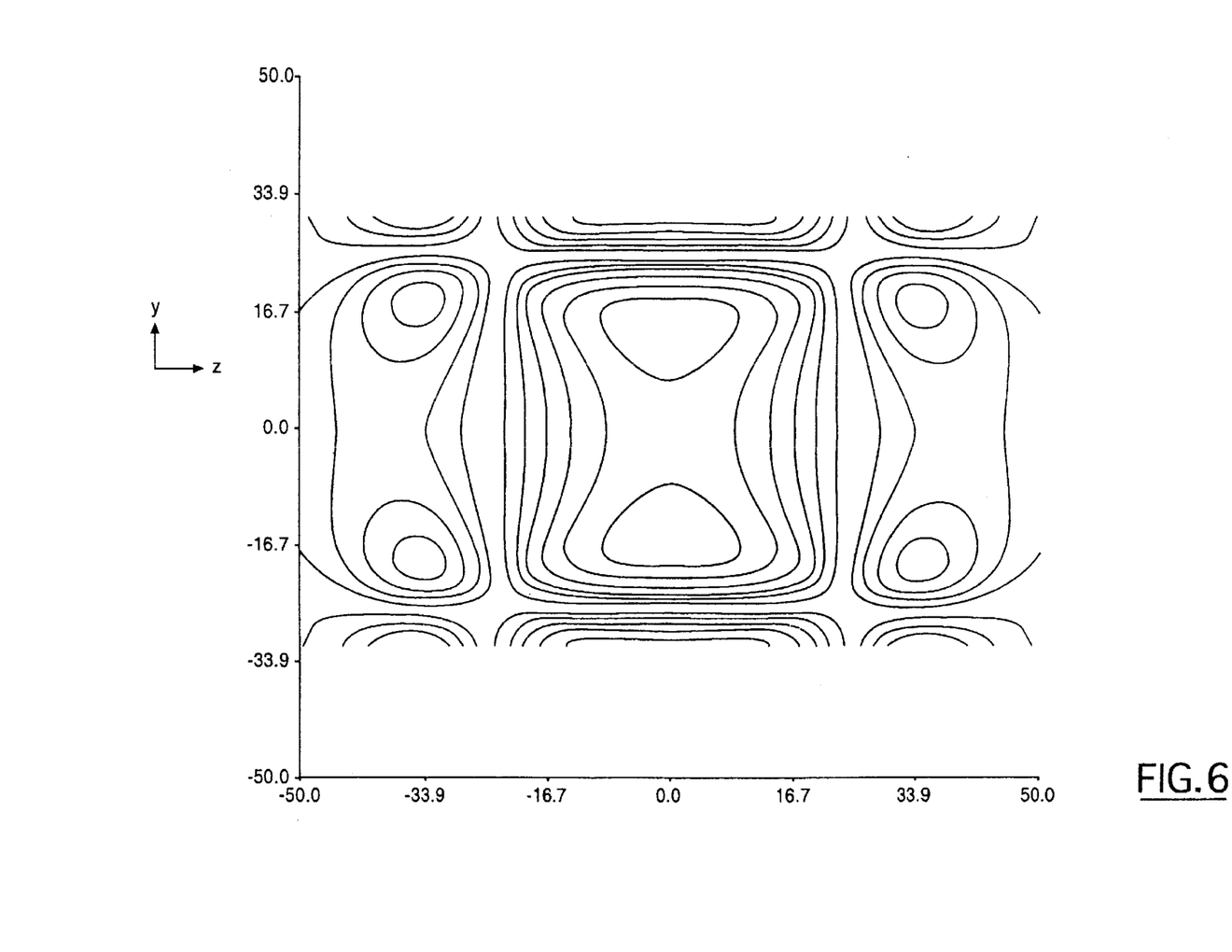
FIG. 6 is an isocontour plot of the RF field amplitudes projected in the x-y plane for the RF coil of FIG. 3.

Referring now to FIG. 6, there is shown an isocontour plot of equal RF field amplitudes in a sagittal plane for a 40 cm primary birdcage 50 with 12 cm spoilers 52, 54 carrying equal but opposite current amplitudes. From the plot shown in FIG. 5, it is clear that at approximately +/−20 cm from the center of the primary birdcage 50 along the z-axis, the magnetic field drops to zero. This occurs much closer to the end rings 56, 58 of the primary birdcage 50 than would otherwise be the case for an unspoiled birdcage. In operation, this area of low sensitivity can be positioned over the areas where aliasing artifacts would otherwise originate thereby eliminating the aliasing artifact by not exciting the spin system in the region of concern.

Figure 3:
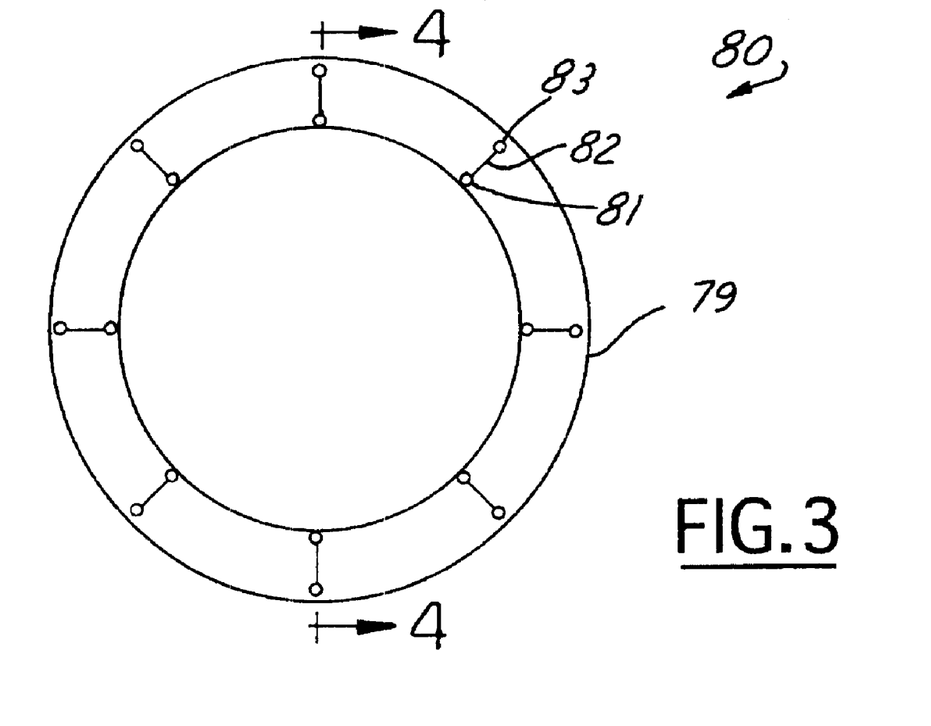
FIG. 3 is a side view of a RF coil according to another embodiment of the present invention.
Figure 4:
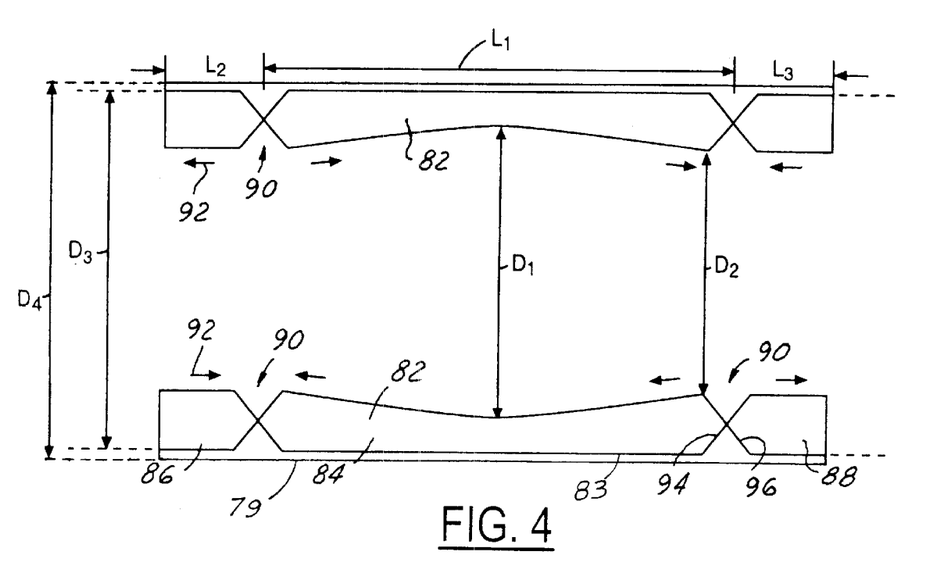
FIG. 4 is a sectional view of the RF coil of FIG. 3 taken along line 4—4.

Referring now to FIG. 4, there is shown a side sectional view of the RF coil arrangement of FIG. 3 taken along line 4—4 to show an opposing pair of conductors 82. As shown in FIG. 4, each conductor 82 of the RF coil comprises a primary coil section 84 having counter coil sections 86, 88 at each end thereof. In a preferred embodiment, the shield diameter D4 of the RF coil 80 is equal to 60 cm, the length L1 of the primary coil 84 is equal to 45 cm and the lengths L2, L3 of the counter coils 86, 88 are equal to 15 cm.

As can be seen in FIG. 4, in the regions 90 where the counter coils 86, 88 are connected to the primary coil 84, the current flow as indicated by arrows 92 is in opposite directions through the conductive element. In this way, the RF magnetic field generated by the RF coil is driven down towards zero in the regions 90 thereby having the same effect as the overlapping birdcage design of FIG. 2. In a preferred embodiment, the coil sections 94, 96 are set at 45° with respect to the horizontal such that they are orthogonal to each other. In addition, it is preferable to have the return current path 83 close to the exterior shield 79. A preferred arrangement comprises a shield diameter D4 of 60 cm and a return current path diameter D3 of approximately 58 cm.

In a further preferred embodiment, the primary coil 84 is tapered from approximately a diameter of 55 cm at D2 to approximately 56.6 cm diameter at its center D1.

Referring now to FIG. 6 there is shown an isocontour plot of equal RF field amplitudes in a sagittal plane for a RF transmit coil according to the present invention having a primary coil length of 40 cm and counter coil lengths of 12 cm. As can be seen in FIG. 6, there is pronounced zero crossing for the RF magnetic field at approximately the end regions of the primary coil. In this regard, the RF coil of the present invention can effectively eliminate aliasing artifacts by not exciting the spin system in the aliasing artifact region.

Similar to the birdcage arrangement as shown in FIG. 2, the RF transmit coil arrangement of FIG. 4 can be configured to optimize the amount of drop off at the end regions 90 of the primary coil 84 as well as the amount by which the RF magnetic field recovers after going through the zero crossing by varying the length L1 of the primary coil 84, the lengths L2, L3 of the counter coils 86, 88, the distances to the RF shield 79 for the counter coils 86, 88 and the primary coil 84, the angle between the conductors in the region 90 between the primary coil 84 and counter coils 86, 88, and the number of counter coils at each end of the primary coil 84.

From the foregoing, it can be seen that there has been brought to the art a new and improved transmission coil for MRI applications which provides advantages over conventional transmission coils. While the invention has been described in connection with one or more embodiments, it should be understood that the invention is not limited to those embodiments. On the contrary, the invention covers all alternatives, modifications, and equivalents, as may be included within the spirit and scope of the appended claims.

What is claimed is:

1. A radio frequency (RF) coil system for resonance imaging/analysis comprising:
   a primary coil comprising plurality of axial conductors spaced to form a generally tubular structure having two ends and defining a coil volume; and
   a first pair of spoiler coils each comprising a plurality of axial conductors spaced to form a generally tubular structure and define a coil volume, each of said spoiler coils positioned adjacent an end of said primary coil;
   wherein each of said primary and spoiler coils is adapted to carry an RF signal, and
   wherein said signal in said axial conductors of said spoiler coils is 180 degrees out of phase with said signal in said axial conductor of said primary coil.

2. The RF coil system of claim 1 comprising a second pair of spoiler coils each comprising a plurality of axial conductors spaced to form a generally tubular structure and define a coil volume, each of said second pair of spoiler coils positioned adjacent an outside end of said first pair of spoiler coils and adapted to carry said RF signal, wherein said signal in said axial conductors of said second pair of spoiler coils is 180 degrees out of phase with said signal in said axial conductors of said first pair of spoiler coils and in phase with said signal in said axial conductors of said primary coil.

3. The RF coil system of claim 1 wherein said first pair of spoiler coils are of equal length and said primary coil is longer than said spoiler coils.

4. The RF coil system of claim 2 wherein said first and second pair of spoiler coils are of equal length and said primary coil is longer than each of said spoiler coils.

5. The RF coil system of claim 1 wherein a current amplitude of said signal in said first pair of spoiler coils is equal, and is less than a current amplitude of said signal in said primary coil.

6. The RF coil system of claim 2 wherein a current amplitude of said signal in said first and second pair of spoiler coils is equal, and is less than a current amplitude of said signal in said primary coil.

7. The RF coil system of claim 1 wherein said primary coil is approximately 40 centimeters in length and each of said spoiler coils is approximately 12 centimeters in length.

8. The RF coil system of claim 7 wherein each of said spoiler coils overlaps an end of said primary coil by approximately 2 to 10 millimeters.

9. The RF coil system of claim 1 wherein the plurality of axial conductors in each of the primary coil and spoiler coils is equal to between eight and sixteen.

10. A radio frequency (RF) coil apparatus for resonance imaging/analysis comprising:
    a primary coil having a plurality of axial conductors spaced to form a generally tubular structure and define a coil volume, each axial conductor having first and second ends, a first ring conductor coupled to the first ends, and a second ring conductor coupled to the second ends;
    a first spoiler coil comprising a plurality of axial conductors spaced to form a generally tubular structure and define a coil volume, each axial element having first and second ends, a third ring conductor coupled to the first ends, and a fourth ring conductor coupled to the second ends, wherein said fourth ring conductor is positioned between said first and second ring conductors such that said first spoiler coil overlaps an end of said primary coil; and
    a second spoiler coil comprising a plurality of axial conductors spaced to form a generally tubular structure and define a coil volume, each axial element having first and second ends, a fifth ring conductor coupled to the first ends, and a sixth ring conductor coupled to the second ends, wherein said fifth ring conductor is positioned between said first and second ring conductors such that said second spoiler coil overlaps another end of said primary coil;
    wherein each of said primary and spoiler coils is adapted to carry an RF signal, and
    wherein said signal in said spoiler coils is 180 degrees out of phase with said signal in said primary coil.

11. The RF coil system of claim 10 wherein said first and second spoiler coils are of equal length and said primary coil is longer than said first and second spoiler coils.

12. The RF coil system of claim 10 wherein a current amplitude of said signal in said first and second spoiler coils is equal, and is less than a current amplitude of said signal in said primary coil.

13. The RF coil system of claim 10 wherein said primary coil is approximately 40 centimeters in length and said first and second spoiler coils are approximately 12 centimeters in length.

14. The RF coil system of claim 13 wherein said first and second spoiler coils each overlap an end of said primary coil element by approximately 2 to 10 millimeters.

15. The RF coil system of claim 10 wherein the plurality of axial conductors in each of the primary coil and first and second spoiler coils is equal to between eight and sixteen.

16. A RF coil apparatus for use in an nuclear magnetic resonance (NMR) system having a generally tubular structure defined by an inner wall and an outer wall, said inner wall defining an imaging volume, the RF coil comprising a plurality of electrically conductive members positioned between said inner wall and said outer wall and equally circumferentially spaced around said tubular structure so as to form opposing pairs of conductive members, each of said conductive members comprising a conductive loop having a primary coil section and a spoiler coil section at each end of said primary coil section configured such that a current flow of a signal on said loop in a cross-over region between each of said spoiler coils and said primary coil is in opposite directions.

17. The RF coil apparatus of claim 16 wherein opposing pairs of conductors define an inner diameter along a primary conducting path of said conducting loop and an outer diameter along a return conductive path of said conducting loop, the return conductive path of each of said opposing pairs of conductive elements being adjacent said outer wall and the inner diameter being variable along a length of opposing primary coil sections.

18. The RF coil of claim 17 wherein said inner diameter is greater in a center portion of opposing primary coil sections than between opposing end portions of said primary coil sections.

19. The RF coil of claim 17 wherein each of said primary coils is between approximately 40 and 45 centimeters long and each of said spoiler coils is between approximately 12 and 15 centimeters long.

20. The RF coil of claim 19 wherein said inner diameter is approximately 56.6 centimeters between center portions of opposing primary coil sections and approximately 55 centimeters between end portions of opposing primary coil sections.

* * * * *